US010586917B2

(12) United States Patent
Lim et al.

(10) Patent No.: US 10,586,917 B2
(45) Date of Patent: Mar. 10, 2020

(54) ELECTRONIC DEVICE AND METHOD FOR FABRICATING THE SAME

(71) Applicants: SK hynix Inc., Gyeonggi-do (KR); TOSHIBA MEMORY CORPORATION, Tokyo (JP)

(72) Inventors: Jong-Koo Lim, Gyeonggi-do (KR); Won-Joon Choi, Gyeonggi-do (KR); Guk-Cheon Kim, Gyeonggi-do (KR); Yang-Kon Kim, Gyeonggi-do (KR); Ku-Youl Jung, Gyeonggi-do (KR); Toshihiko Nagase, Tokyo (JP); Youngmin Eeh, Tokyo (JP); Daisuke Watanabe, Tokyo (JP); Kazuya Sawada, Tokyo (JP); Makoto Nagamine, Tokyo (JP)

(73) Assignees: SK hynix Inc., Gyeonggi-do (KR); TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/203,114

(22) Filed: Nov. 28, 2018

(65) Prior Publication Data
US 2019/0109280 A1 Apr. 11, 2019

Related U.S. Application Data

(63) Continuation of application No. 15/187,267, filed on Jun. 20, 2016, now Pat. No. 10,170,691.

(60) Provisional application No. 62/288,213, filed on Jan. 28, 2016.

(51) Int. Cl.
| | | |
|---|---|---|
| *H01L 43/08* | (2006.01) | |
| *H01L 43/10* | (2006.01) | |
| *H01L 43/12* | (2006.01) | |

(52) U.S. Cl.
CPC .............. *H01L 43/08* (2013.01); *H01L 43/10* (2013.01); *H01L 43/12* (2013.01)

(58) Field of Classification Search
CPC ......... H01L 43/08; H01L 43/10; H01L 43/12; H01L 43/02; H01L 27/222; G11C 11/161; G11C 11/15; H01F 10/329; H01F 10/3286
See application file for complete search history.

(56) References Cited

U.S. PATENT DOCUMENTS

| | | | |
|---|---|---|---|
| 8,957,486 B2 * | 2/2015 | Ito ........................... | G11C 11/16 257/421 |
| 10,133,689 B2 * | 11/2018 | Kim .................... | G06F 12/0802 |
| 10,170,691 B2 * | 1/2019 | Lim ........................ | H01L 43/08 |
| 2005/0019610 A1 * | 1/2005 | Fujikata ................. | B82Y 10/00 428/811.1 |
| 2010/0291378 A1 * | 11/2010 | Rappe ................... | C04B 35/472 428/336 |

(Continued)

*Primary Examiner* — Caridad Everhart
(74) *Attorney, Agent, or Firm* — IP & T Group LLP

(57) ABSTRACT

Provided is a method for fabricating an electronic device including a variable resistance element which includes a free layer formed over a substrate and having a changeable magnetization direction, a pinned layer having a pinned magnetization direction, a tunnel barrier layer interposed between the free layer and the pinned layer, and a magnetic correction layer suitable for reducing the influence of a stray field generated by the pinned layer. The method may include: cooling the substrate; and forming the magnetic correction layer over the cooled substrate.

16 Claims, 8 Drawing Sheets

(56) References Cited

U.S. PATENT DOCUMENTS

| | | | | |
|---|---|---|---|---|
| 2012/0261777 A1* | 10/2012 | Shukh | ................ | H01L 43/08 |
| | | | | 257/421 |
| 2012/0287696 A1* | 11/2012 | Ohmori | ............... | H01L 27/226 |
| | | | | 365/66 |
| 2016/0005449 A1* | 1/2016 | Carey | ................ | G11C 11/161 |
| | | | | 257/421 |
| 2017/0200499 A1* | 7/2017 | Rakshit | ............. | G11C 14/0081 |
| 2017/0279037 A1* | 9/2017 | Saida | ................ | H01L 43/08 |

\* cited by examiner

ELECTRONIC DEVICE AND METHOD FOR FABRICATING THE SAME

CROSS-REFERENCE TO RELATED APPLICATIONS

This application is a continuation of U.S. patent application Ser. No. 15/187,267 filed on Jun. 20, 2016 which claims benefits of U.S. Provisional Application No. 62/288,213 filed on Jan. 28, 2016. The disclosure of each of the foregoing application is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device including a variable resistance element having improved performance.

In an implementation, there is provided a method for fabricating an electronic device including a variable resistance element which includes a free layer formed over a substrate and having a changeable magnetization direction, a pinned layer having a pinned magnetization direction, a tunnel barrier layer interposed between the free layer and the pinned layer, and a magnetic correction layer suitable for reducing the influence of a stray field generated by the pinned layer. The method may include: cooling the substrate; and forming the magnetic correction layer over the cooled substrate.

The cooling of the substrate may be performed at 0K-75K, inclusive. The cooling of the substrate may be performed at 40K-60K, inclusive. The forming of the magnetic correction layer may include: a first step of forming a first layer, wherein the first layer includes a magnetic material; a second step of forming a second layer over the first layer, wherein the second layer includes a non-magnetic material; and repeating the first and the second steps M number of times, wherein M is a positive integer. The magnetic material may include Co, Fe, Ni, or a combination thereof. The non-magnetic material may include Pt, Pd, or a combination thereof.

The forming of the magnetic correction layer may further include: a third step of recooling the substrate after repeating the first and the second steps M number of times. M number of repetitions of the first and the second steps and one time of the third step, in combination, may include a unit cycle. The unit cycle may be repeated N number of times, and wherein N is a positive integer. N may be more than at least 4. The third step of recooling may be performed at 0K-75K, inclusive. The third step of recooling may be performed at 40K-60K, inclusive. The first step, the second step, and the third step may be performed at the same temperature. The free layer, the pinned layer, and the tunnel barrier layer may be formed at a temperature of 273K or more.

In an implementation, there is provided a method for fabricating an electronic device having a multilayer thin film which is formed over a substrate and in which a plurality of first layers containing a magnetic material and a plurality of second layers containing a non-magnetic material are alternately stacked. The method may include: (a) cooling the substrate; (b) forming the multilayer thin film over the cooled substrate; (c) recooling the substrate; and (d) repeating the steps (b) and (c) N number of times, where each of N and M is a positive integer. The forming of the multilayer thin film may include: forming a first layer over the cooled substrate; forming a second layer over the first layer; and repeating the forming of the first layer and the forming of the second layer M number of times.

N may be more than at least 4. Each of the cooling of the substrate and the recooling of the substrate may be performed at 0K-75K, inclusive. Each of the cooling of the substrate and the recooling of the substrate may be performed at 40K-60K, inclusive. The cooling of the substrate and the recooling of the substrate may be performed at the same temperature. The magnetic material may include Co, Fe, Ni, or a combination thereof. The non-magnetic material may include Pt, Pd, or a combination thereof.

In an implementation, there is provided an electronic device including a semiconductor memory. The semiconductor memory may include: a free layer having a changeable magnetization direction; a pinned layer having a magnetization direction pinned in a first direction; a tunnel barrier layer interposed between the free layer and the pinned layer; a magnetic correction layer having a magnetization direction pinned in a second direction, wherein the second direction is the opposite direction to the first direction; and a spacer layer interposed between the pinned layer and the magnetic correction layer, wherein the pinned layer and the magnetic correction layer exchange coupling with each other through the spacer layer, and wherein a roughness at an interface between the magnetic correction layer and the spacer layer is lower than a roughness at an interface between the spacer layer and the pinned layer.

A first mixing layer may be formed at the interface between the magnetic correction layer and the spacer layer, wherein a second mixing layer may be formed at the interface between the spacer layer and the pinned layer, and wherein a thickness of the first mixing layer may be smaller than a thickness of the second mixing layer. The magnetic correction layer may include a plurality of first layers and a plurality of second layers which are alternately stacked, wherein each of the plurality of first layers may include a magnetic material, and wherein each of the plurality of second layers may include a non-magnetic material. The magnetic material may include Co, Fe, Ni, or a combination thereof. The non-magnetic material may include Pt, Pd, or a combination thereof.

The electronic device may further including a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further including a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further including a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further including a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further including a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device may include: forming a variable resistance element at a first temperature; and forming a magnetic correction layer over the pinned layer at a second temperature, wherein the second temperature is lower than the first temperature, wherein the variable resistance element includes a free layer provided over a substrate, a pinned layer provided over the free layer, a tunnel barrier layer interposed between the free layer and the pinned layer, wherein the magnetic correction layer has a magnetization direction which is anti-parallel to the pinned layer.

The second temperature may be at 0K-75K, inclusive. The first temperature may be at 273K or more. The forming of the magnetic correction layer may include: (a) cooling the substrate to the second temperature; (b) forming a first layer over the cooled substrate; (c) forming a second layer over the first layer; (d) repeating the forming of the first layer and the forming of the second layer M number of times; and (e) recooling the substrate to a third temperature, wherein the third temperature may be 0K-75K, inclusive, and where M is a positive integer. The steps (b)-(e) may be repeated N number of times, and Where N is a positive integer. N may be 4-100. M may be 1-100.

DETAILED DESCRIPTION

Figure 1:
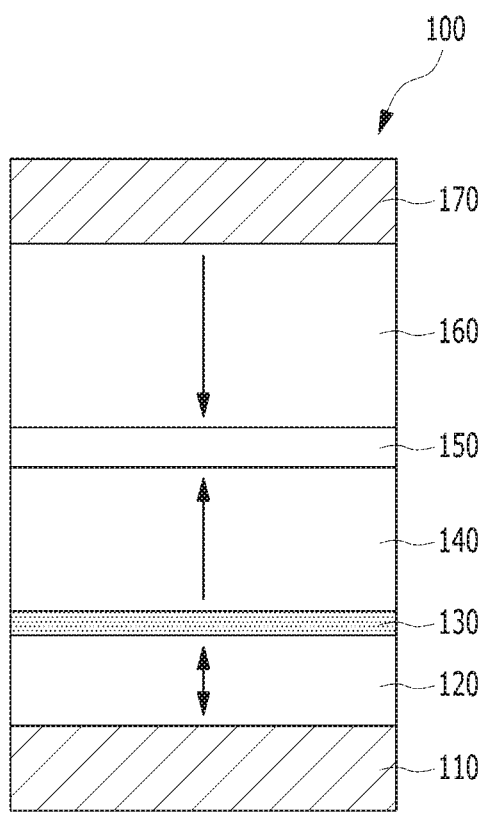
FIG. 1 is a cross-sectional view of a variable resistance element in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view of a variable resistance element in accordance with an implementation. As illustrated in FIG. 1, the variable resistance element 100 may include a bottom layer 110, a free layer 120 formed over the bottom layer 110 and having a changeable magnetization direction, a tunnel barrier layer 130 formed over the free layer 120, a pinned layer 140 formed over the tunnel barrier layer 130 and having a pinned magnetization direction, a spacer layer 150 formed over the pinned layer 140, a magnetic correction layer 160 formed over the spacer layer 150, and a capping layer 170 formed over the magnetic correction layer 160. The variable resistance element may include a structure which includes the free layer 120, the pinned layer 140, and the tunnel barrier layer 130 and is referred to as a Magnetic Tunnel Junction (MTJ) structure.

The MTJ structure, may store data according to the magnetization direction thereof. The magnetization direction of the free layer 120 is changeable. Thus, the free layer 120 may be referred to as a storage layer. The magnetization direction of the free layer 120 may be changed by spin transfer torque. The pinned layer 140 having the pinned magnetization direction may be referred to as a reference layer of which the magnetization direction can be compared to the magnetization direction of the free layer 120. The tunnel barrier layer 130 may change the magnetization direction of the free layer 120 through electron tunneling.

The free layer 120 and the pinned layer 140 may have magnetization directions perpendicular to the surfaces of the respective layers. For example, as indicated by arrows of FIG. 1, the magnetization direction of the free layer 120 may be changed from top to bottom or from bottom to top, and the magnetization direction of the pinned layer 140 may be pinned to the direction from top to bottom.

According to a voltage or current app led to the variable resistance element 100, the magnetization direction of the free layer 120 may be changed to be parallel or anti-parallel to the magnetization direction of the pinned layer 140. Thus, the variable resistance element 100 may switch between a low-resistance state in which the magnetization direction is parallel to the pinned layer 140 and a high-resistance state in which the magnetization direction is anti-parallel to the pinned layer 140, and store different data through the switching operation. That is, the variable resistance element 100 may function as a memory cell.

Each of the free layer 120 and the pinned layer 140 may have a single-layer or multilayer structure including a ferromagnetic material. For example, each of the free layer 120 and the pinned layer 140 may include an alloy based on Fe, Ni, or Co, such as Co—Fe—B alloy, Co—Fe—B—X alloy, Fe—Pt alloy, Fe—Pd alloy, Co—Pd alloy, Co—Pt alloy, Fe—Ni—Pt alloy, Co—Fe—Pt alloy, Co—Ni—Pt alloy, Fe—Pd alloy, Co—Pd alloy, Co—Pt alloy, Fe—Ni—Pt alloy, Co—Fe—Pt alloy, or Co—Ni—Pt alloy, where X represents Al, Si, Ti, V, Cr, Ni, Ga, Ge, Zr, Nb, Mo, Pd, Ag, Hf, Ta, W, or Pt. Each of the free layer 120 and the pinned layer 140 may include a stacked structure such as Co/Pt or Co/Pd. Furthermore, each of the free layer 120 and the pinned layer 140 may have a stacked structure in which a magnetic substance and a non-magnetic substance are alternately stacked. The tunnel barrier layer 130 may include an insulating oxide such as MgO, CaO, SrO, TiO, VO, or NbO.

The variable resistance element 100 may further include various functional layers for improving characteristics of the MTJ structure. In an embodiment, the various functional layers may include the bottom layer 110, the spacer layer 150, the magnetic correction layer 160, and the capping layer 170. However, the present implementation is not limited thereto.

The bottom layer 110 may be used to improve the perpendicular magnetic anisotropy or crystallinity of the layer positioned thereon, for example, the free layer 120. The bottom layer 110 may have a single-layer or multilayer structure including various conductive materials such as metal and metal nitride.

The magnetic correction layer 160 may offset or reduce the influence of a stray field which is generated by the pinned layer 140. When the influence on the free layer 120 by the stray field of the pinned layer 140 is decreased, a bias magnetic field in the free layer 120 reduces. The magnetic correction layer 160 may be formed over a cooled substrate, and have a stacked structure in which a magnetic substance and a non-magnetic substance are alternately stacked. Specifically, the magnetic correction layer 160 may have a multilayer structure in which a first layer including a magnetic material and a second layer including a non-magnetic material are alternately stacked.

The magnetic material may include Co, Fe, and Ni, and the non-magnetic material may include Pt and Pd. Since the magnetic correction layer 160 is formed over the cooled substrate, the formation of a mixing layer may be suppressed at the interface between the magnetic correction layer 160 and a layer connected to the magnetic correction layer 160, for example, the spacer layer 150 and the interface between the magnetic correction layer 160 and the capping layer 170, compared to other interfaces in the MTJ structure, for example, the interface between the pinned layer 140 and the spacer layer 150. Specifically, a first mixing layer is formed at the interface between the magnetic correction layer and the spacer layer, and a second mixing layer is formed at the interface between the spacer layer and the pinned layer. Herein, a thickness of the first mixing layer is smaller than a thickness of the second mixing layer.

Furthermore, the magnetic correction layer 160 may have low roughness. Specifically, a roughness at an interface between the magnetic correction layer and the spacer layer is lower than a roughness at an interface between the spacer layer and the pinned layer. Low roughness can improve the characteristics of the magnetic correction layer 160.

The magnetic correction layer 160 may have a magnetization direction which is anti-parallel to the magnetization direction of the pinned layer 140. In an embodiment, when the pinned layer 140 has a magnetization direction from bottom to top, the magnetic correction layer 160 may have a magnetization direction from top to bottom. Alternatively, when the pinned layer 140 has the magnetization direction from top to bottom, the magnetic correction layer 160 may have the magnetization direction from bottom to top.

The spacer layer 150 may be interposed between the magnetic correction layer 160 and the pinned layer 140, and used to provide exchange coupling therebetween. The spacer layer 150 may include a metallic non-magnetic material, for example, Cr, Ru, Ir, or Rh.

The capping layer 170 may function as a hard mask when the variable resistance element 100 is patterned. The capping layer 170 may include various conductive materials such as metal.

In the variable resistance element 100 including the above-described MTJ structure, the stray field of the pinned layer 140 may disturb normal switching such as magnetization switching of the free layer 120. Thus, as the stray field of the pinned layer 140 is offset by the magnetic correction layer 160, the characteristics of the variable resistance element 100 can be improved. For this operation, a variety of methods have been proposed, which includes a method using a material with a large magnetic moment as the magnetic correction layer 160, a method of increasing the thickness of the magnetic correction layer 160, or a method of decreasing the thickness of the pinned layer 140 to reduce a stray field generated in the pinned layer 140.

However, the above-described methods have the following drawbacks. For example, the material with a large magnetic moment may have poor perpendicular magnetic anisotropy or low stability. The method of increasing the thickness of the magnetic correction layer 160 may make it difficult to pattern the variable resistance element 100. The method of decreasing the thickness of the pinned layer 140 may reduce the perpendicular magnetic anisotropy of the pinned layer 140.

Thus, it is necessary to improve the characteristic of the magnetic correction layer 160 without compromising the shape of the variable resistance element 100. The shape of the variable resistance element 100 may indicate the applied materials and the stacked structure. In an embodiment, the applied materials and the stacked structure will be described below in detail.

The present implementation may provide a method capable of increasing the anisotropy field (Hk) of the magnetic correction layer 160 without compromising the magnetic moment (Ms*t) of the magnetic correction layer 160. For this method, the magnetic correction layer 160 may be formed in an ultra-low temperature state. The ultra-low temperature may indicate a temperature of 75K or less (0K-75K). Specifically, the ultra-low temperature may be 40K-60K. Desirably, the ultra-low temperature may be set to 50K. Hereafter, the method will be described below in more detail with reference to FIG. 2.

Figure 2:
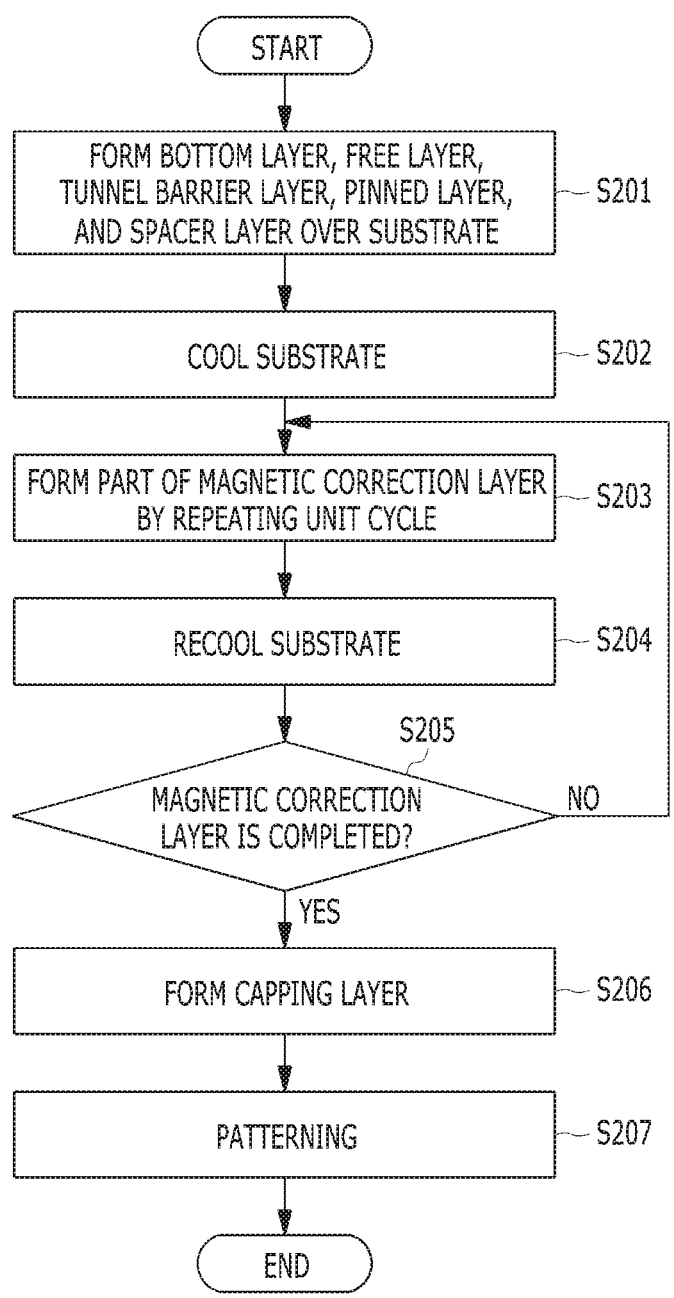
FIG. 2 is a flowchart illustrating a method for fabricating the variable resistance element of FIG. 1.

FIG. 2 is a flowchart illustrating a method for fabricating the variable resistance element of FIG. 1. Referring to FIG. 2, the bottom layer 110, the free layer 120, the tunnel barrier layer 130, the pinned layer 140, and the spacer layer 150 may be sequentially deposited over the substrate (not illustrated), at step S201. The bottom layer 110, the free layer 120, the tunnel barrier layer 130, the pinned layer 140, and the spacer layer 150 may be formed at a temperature of 0° C. (or 273K) or more, for example, at a room temperature.

Each of the free layer 120 and the pinned layer 140 which includes a ferromagnetic material may be formed through Physical Vapor Deposition (PVD). Since the ferromagnetic material is composed of various elements, various source materials with small sizes may be used during the PVD process for forming the free layer 120 and the pinned layer 140, and the free layer 120 and the pinned layer 140 may be deposited while the substrate is rotated.

The substrate over which the bottom layer 110, the free layer 120, the tunnel barrier layer 130, the pinned layer 140, and the spacer layer 150 are formed may be placed in a stage chamber having an ultra-low temperature of 75K or less and then cooled down, at step S202. At this time, the substrate may be cooled down to a temperature of 50K.

The magnetic correction layer 160 may be formed over the cooled substrate. The forming of the magnetic correction layer 160 may include performing a plurality of unit cycles to form a part of the magnetic correction layer 160 at step S203, recooling the substrate at step S204, and determining the completion of the magnetic correction layer 160 at step S205. The unit cycle for forming the magnetic correction layer 160 may include forming a first layer containing a magnetic material over the cooled substrate and successively forming a second layer containing a non-magnetic material over the first layer. The first and second layers may be formed through a rotation deposition method using the PVD process, for example, a sputtering process. The magnetic material may include Co, Fe, and Ni, and the non-magnetic material may include Pt and Pd. The magnetic correction layer 160 may be formed of a multiple layer.

Each individual layer of the multiple layers is formed in a unit cycle. For example, when the magnetic correction layer 160 is formed by a repetition of four cycles, the magnetic correction layer 160 may include four layers. Each of the layers may have the same thickness as each other. In another embodiment, each of the layers may have different thicknesses from each other.

The recooling of the substrate at step S204 may include moving the substrate, over which the bottom layer 110, the free layer 120, the tunnel barrier layer 130, the pinned layer 140, the spacer layer 150, and the part of the magnetic correction layer 160 are formed, to the stage chamber having for example, an ultra low temperature of 75K or less then cooling down the substrate. At this time, the substrate may be cooled down to a temperature of 50K. That is, the cooling of the substrate at step S202 and the recooling of the substrate at step S204 may be performed at the same temperature. The recooling of the substrate at step S204 prevents the temperature of the substrate from increasing and maintains the substrate at a predetermined level of temperature, during the process for forming the magnetic correction layer 160, thereby improving the characteristic of the magnetic correction layer 160, particularly the anisotropy field. To meet requirements for a device, the step (S204) for recooling the substrate may be repeated at least 4 cycles to form the magnetic correction layer 160.

In summary, the steps S202 to S204 include (a) cooling the substrate, (b) forming the multilayer thin film over the cooled substrate, (c) recooling the substrate, and (d) repeating the steps (b) and (c) N number of times. N is a positive integer. For example, N is more than at least 4. Specifically, N is 4-100. In step S202, the step of (a) cooling the substrate is performed. In step S203, the step of (b) forming the multilayer thin film over the cooled substrate is performed. In step S204, the step of (c) recooling the substrate is performed.

The step S203 of forming of the multilayer thin film includes: forming a first layer over the cooled substrate; forming a second layer over the first layer; and repeating the forming of the first layer and the forming of the second layer M number of times. M is a positive integer. For example, M is more than at least 1. Specifically, M is 1-100.

Each of the cooling of the substrate and the recooling of the substrate may be performed at 0K-75K, inclusive. Each of the cooling of the substrate and the recooling of the substrate may be performed at 40K-60K, inclusive. Specifically, each of the cooling of the substrate and the recooling of the substrate may be performed at 50K. The cooling of the substrate and the recooling of the substrate may be performed at the same temperature or at different temperatures from each other.

The determining of the completion of the magnetic correction layer 160 at step S205 may include counting how many times of the steps S202 and S204 are repeated.

Then, the capping layer 170 may be formed over the magnetic correction layer 160 at step S206. The capping layer 170 may be formed at a temperature of 0° C. (or 273K) or more, for example, at a room temperature.

The bottom layer 110, the free layer 120, the tunnel barrier layer 130, the pinned layer 140, the spacer layer 150, the magnetic correction layer 160, and the capping layer 170 may be patterned to form the pillar-shaped variable resistance element 100 as illustrated in FIG. 1, at step S207.

As described above, when the magnetic correction layer 160 is formed over the cooled substrate, exchange coupling between the magnetic correction layer 160 and the pinned layer 140 may be strengthened. Since the heat energy at the surface of the spacer layer 150 is lowered by the cooled substrate when the magnetic correction layer 160 is deposited, the formation of a mixing layer is suppressed from being formed between the spacer layer 150 and the magnetic correction layer 160. Thus, the roughness can be reduced and magnetic deterioration of the magnetic correction layer 160 due to the mixing layer and the roughness may be prevented.

Furthermore, when the magnetic correction layer 160 is formed over the cooled substrate, the characteristic of the magnetic correction layer 160 can be improved without compromising the property of the variable resistance element 100. Specifically, as the magnetic correction layer 160 is formed at a temperature of 75K or less, or particularly at an ultra-low temperature, of 50K, the anisotropy field (Hk) of the magnetic correction layer 160 can be increased while the magnetic moment (Ms*t) of the magnetic correction layer 160 is maintained. This was experimentally confirmed, and the experimental data will be described in detail with reference to FIGS. 3A and 3B.

Figure 3A:
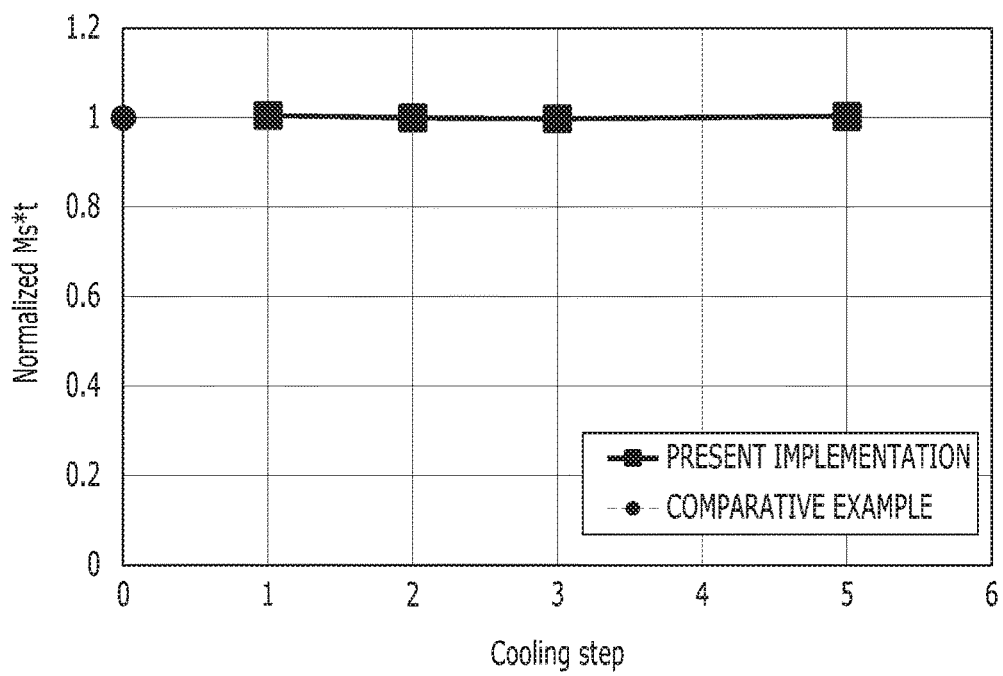
FIG. 3A is a graph illustrating a relationship between the magnetic moment of a magnetic correction layer and the number of cooling steps.

FIG. 3A is a graph illustrating the relationship between the magnetic moment of the magnetic correction layer and the number of cooling steps shown in FIG. 2.

In FIG. 3A, a comparative example was obtained by forming the magnetic correction layer 160 without a cooling process. The magnetic moment of the magnetic correction layer 160 in accordance with the present implementation was normalized based on the comparative example.

Figure 3B:
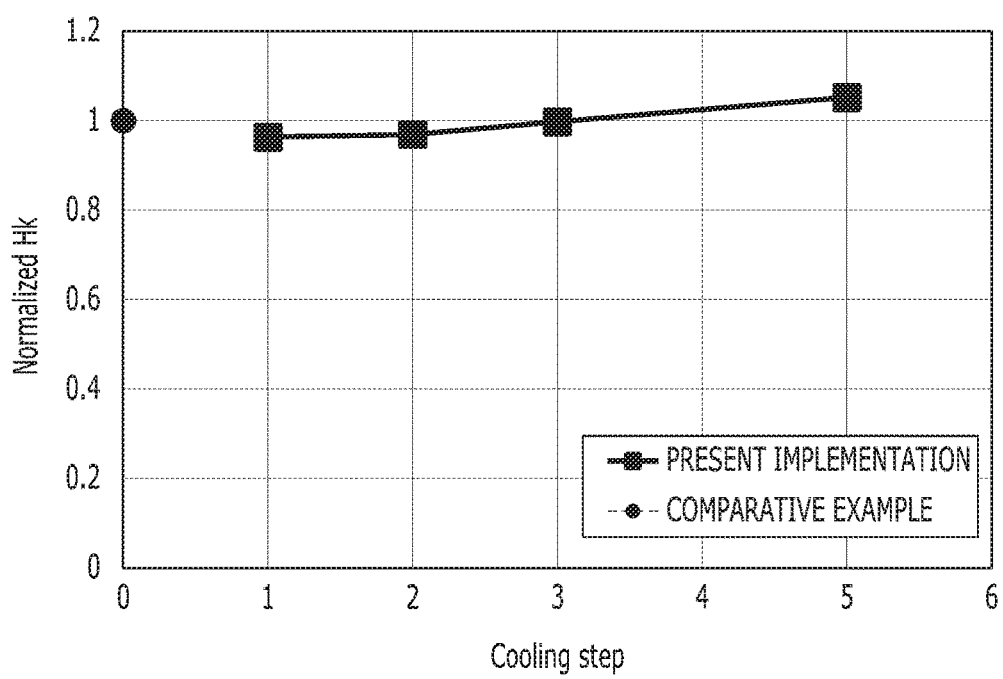
FIG. 3B is a graph illustrating a relationship between the anisotropy field of the magnetic correction layer and the number of cooling steps.

Referring to FIGS. 3A and 3B, the circled dot represents the comparative example which is not subject to the cooling process. The squared dots represent an embodiment according to the present invention. The first square dot marked at "1" corresponds to the cooling step S202. Each of the second, the third, the fourth, and the fifth square dots marked at "2," "3," "4," and "5," respectively, corresponds to the retooling step S204.

Referring to FIG. 3A, regardless how many number of cooling and recooling steps S202, S204 for the substrate are increased, the magnetic moment in accordance with the implementation remains equal to the magnetic moment in accordance with the comparative example. This may indicate that the magnetic correction layer 160 in accordance with the comparative example and the magnetic correction layer 160 in accordance with the implementation have the same material and stacked structure. In other words, the magnetic correction layer 160 in accordance with the comparative example and the magnetic correction layer 160 in accordance with the implementation have substantially the same property. That is, this indicates that the cooling and recooling steps do not deteriorate the magnetic correction layer 160 in magnetic moment.

FIG. 3B is a graph illustrating the relationship between the anisotropy field of the magnetic correction layer and the number of cooling steps shown in FIG. 2. In FIG. 3B, a comparative example was obtained by forming the magnetic correction layer 160 without a cooling process. The anisotropy field value of the magnetic correction layer 160 in accordance with the present implementation was normalized based on the comparative example.

Referring to FIG. 3B, as the number of cooling and recooling steps S202 and S204 increases, the anisotropy field in accordance with the present implementation gradually increases in comparison to the anisotropy field in accordance with the comparative example. In FIGS. 3A and 3B, 'cooling step 1' may correspond to the cooling at step S202 in FIG. 2, and 'cooling steps 2' to 'cooling step 5' may correspond to the recooling at step S204 in FIG. 2. Therefore, due to the cooling and the recooling steps S202 and S204, the anisotropy field of the magnetic correction layer 160 can be improved. The steps S203 and S204 may be repeated until the magnetic correction layer 160 is formed to a desired thickness, for example, N number of times. N is a positive integer. In an embodiment, N may be more than at least 4.

In FIG. 1, the bottom layer 110, the free layer 120, the tunnel barrier layer 130, the pinned layer 140, the spacer layer 150, the magnetic correction layer 160, and the capping layer 170 are sequentially stacked over the substrate. However, the present implementation is not limited thereto. As long as the tunnel barrier layer 130 is interposed between the free layer 120 and the pinned layer 140 and the spacer layer 150 is interposed between the pinned layer 140 and the magnetic correction layer 160, the sequence in which the layers are stacked may be changed. Another structure will be described in detail with reference to FIG. 4.

Figure 4:
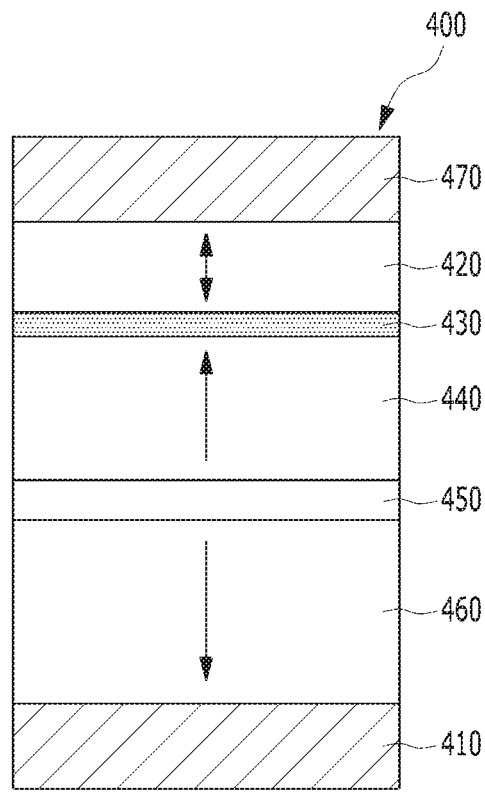
FIG. 4 is a cross-sectional view of a variable resistance element in accordance with an implementation.

FIG. 4 is a cross-sectional view of a variable resistance element in accordance with an implementation. As illustrated in FIG. 4, the variable resistance element 400 in accordance with the implementation may include a bottom layer 410, a magnetic correction layer 460 over the bottom layer 410, a spacer layer 450 over the magnetic correction layer 460, a pinned layer 440 over the spacer layer 450, a tunnel barrier layer 430 over the pinned layer 440, a free layer 420 over the tunnel barrier layer 430, and a capping layer 470 over the free layer 420.

The bottom layer 410, the free layer 420, the tunnel barrier layer 430, the pinned layer 440, the spacer layer 450, the magnetic correction layer 460, and the capping layer 470 include the same material as the bottom layer 110, the free layer 120, the tunnel barrier layer 130, the pinned layer 140, the spacer layer 150, the magnetic correction layer 160, and the capping layer 170 shown in FIG. 1, respectively, and have the same function as the bottom layer 110, the free layer 120, the tunnel barrier layer 130, the pinned layer 140, the spacer layer 150, the magnetic correction layer 160, and the capping layer 170 shown in FIG. 1, respectively.

The magnetic correction layer 460 may be formed in a state in which the substrate having the bottom layer 410 formed thereon is cooled. Thus, a mixing layer may be suppressed from being formed at the interface between the magnetic correction layer 460 and a layer connected to the magnetic correction layer 460, for example, the bottom layer 410 and the interface between the magnetic correction layer 460 and the spacer layer 450, compared to other interfaces in the MTJ structure, for example, the interface between the pinned layer 440 and the spacer layer 450. Furthermore, the interfaces may have lower roughness than the other interfaces. Thus, the characteristic of the magnetic correction layer 460 improves.

In accordance with implementation, it is possible to improve characteristics of the variable resistance element and improve characteristics of the semiconductor memory including the variable resistance element and the electronic device including the semiconductor device.

The variable resistance element in accordance with the implementations of the present disclosure, for example, the variable resistance element 100 of FIG. 1 may be provided in plural to form a cell array. The cell array may include various components to drive the variable resistance element 100. This will be exemplarily described below with reference to FIGS. 5 and 6.

Figure 5:
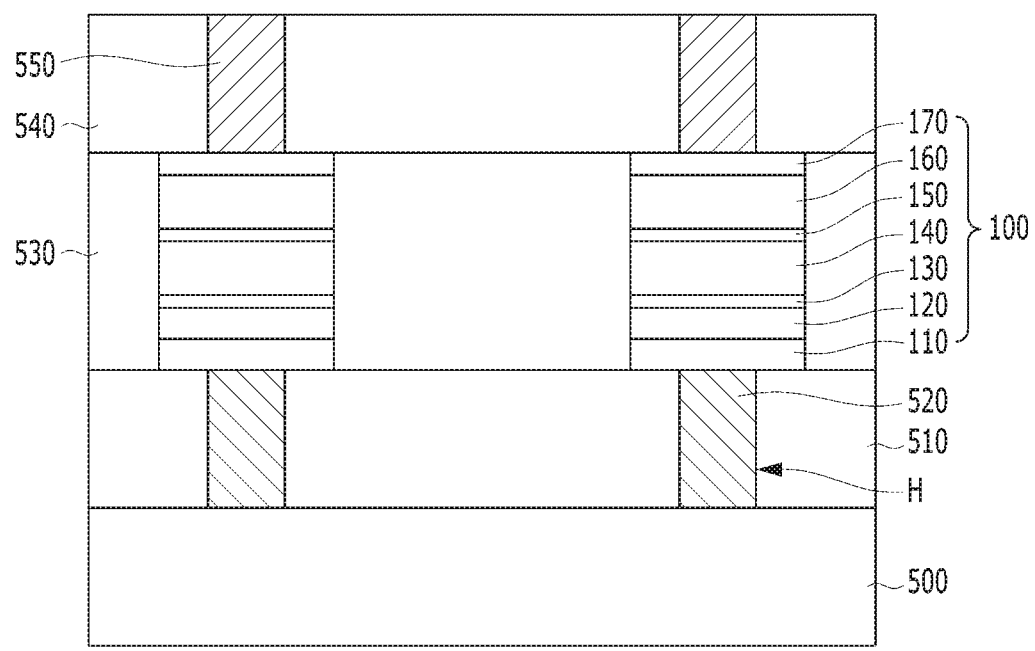
FIG. 5 is a cross-sectional view illustrating a memory device and a method for fabricating the same in accordance with an implementation of the present disclosure.

FIG. 5 is a cross-sectional view illustrating an exemplary memory device and a method for fabricating the same in accordance with an implementation of the present disclosure. Referring to FIG. 5, the memory device of this implementation may include a substrate 500, a lower contact 520, a variable resistance element 100 and an upper contact 550. The substrate 500 may include, for example, a transistor controlling an access to the variable resistance element 100. The lower contact 520 may be disposed over the substrate 500 and couple a lower end of the variable resistance element 100 with a portion of the substrate 500, for example, a drain of the transistor. The upper contact 550 may be disposed over the variable resistance element 100 and couple an upper end of the variable resistance element 100 with a certain line (not shown), for example, a bit line.

The above memory device may be fabricated by following processes. First, the substrate 500 in which the transistor is formed may be provided, and then, a first interlayer dielectric layer 510 may be formed over the substrate 500. Subsequently, the lower contact 520 may be formed by selectively etching the first interlayer dielectric layer 510 to form a hole exposing a portion of the substrate 500 and filling the hole with a conductive material. Then, the variable resistance element 100 may be formed by forming material layers for the variable resistance element 100 over the first interlayer dielectric layer 510 and the lower contact 520, and selectively etching the material layers. A second interlayer dielectric layer 530 may be formed by filling spaces among the variable resistance elements 100 with an insulating material.

A third interlayer dielectric layer 540 may be formed over the variable resistance element 100 and the second interlayer dielectric layer 530. Then, the upper contact 550 penetrating through the third interlayer dielectric layer 530 and coupled to the upper end of the variable resistance element 100 may be formed.

In the memory device of this implementation, all layers included in the variable resistance element 100 may have sidewalls aligned with each other. The variable resistance element 100 may be formed by an etching process using a single mask.

However, in another embodiment, unlike the implementation of FIG. 5, a portion of the variable resistance element 100 and a remaining portion of the variable resistance element 100 may be patterned individually. This will be exemplarily shown in FIG. 6.

Figure 6:
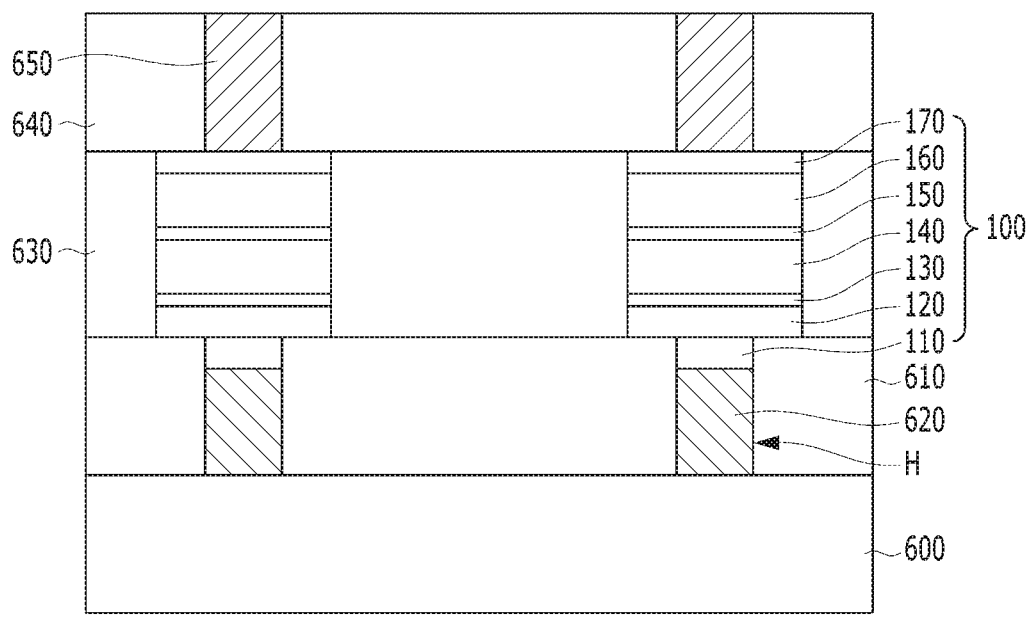
FIG. 6 is a cross-sectional view illustrating a memory device and a method for fabricating the same in accordance with another implementation of the present disclosure.

FIG. 6 is a cross-sectional view illustrating a memory device and a method for fabricating the same in accordance with another implementation of the present disclosure.

Referring to FIG. 6, in the memory device of this implementation, sidewalls of the variable resistance element 100 are not aligned to each other. The under layer 110 has a sidewall which is not aligned to other layers of the variable resistance element 100. Instead, the under layer 110 may have a sidewall which is aligned with a sidewall of a lower contact 620.

The above memory device may be fabricated by following processes. A first interlayer dielectric layer 610 may be formed over a substrate 600, and then, a hole H exposing a portion of the substrate 600 may be formed by selectively etching the first interlayer dielectric layer 610. Then, the lower contact 620 fills in a lower portion of the hole H.

Specifically, the lower contact 620 may be formed by forming a conductive material covering a resultant structure in which the hole H is formed, and removing a portion of the conductive material by an etch back process, etc. until the conductive material has a target height. Then, the under layer 110 is filled in a remaining space of the hole H and over the lower contact 620. For example, the under layer 110 may be formed by forming a material layer which includes a light metal and covers a resultant structure in which the lower contact 620 is formed, and performing a planarization process, for example, a Chemical Mechanical Polishing (CMP) process until a top surface of the first interlayer dielectric layer 610 is exposed.

Then, the remaining portion of the variable resistance element 100 may be formed by forming material layers for the remaining layers of the variable resistance element 100, except for the under layer 110, and selectively etching the material layers. Subsequent processes are substantially the same as the implementation of FIG. 5.

In this implementation, when the stack of the material layers is formed thin, it is easy to etch the stack to form the variable resistance element 100.

In this implementation, the under layer 110 is filled in the hole H. Thus, the thickness of the stack is reduced by the thickness of the under layer 110 and an etch process may be performed more easily.

However, other implementations are also possible. For example, another portion of the variable resistance element 100 can be further formed in the hole H.

The semiconductor memory in accordance with the implementation of the present disclosure may be applied to diverse electronic devices or systems. FIGS. 7 to 11 show some examples of electronic devices or systems that can implement the semiconductor memory disclosed herein.

Figure 7:
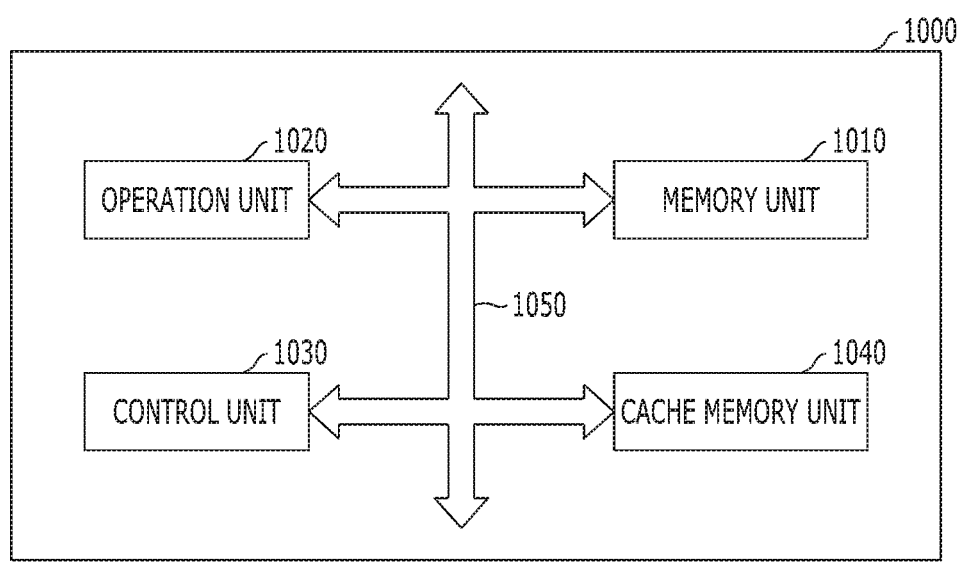
FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. The memory unit 1010 may include semiconductor memory which includes a variable resistance element. The variable resistance element may include a free layer having a changeable magnetization direction; a pinned layer having a magnetization direction pinned to a first direction; a tunnel barrier layer interposed between the free layer and the pinned layer; a magnetic correction layer having a magnetization direction pinned to a second direction which is the opposite direction of the first direction; and a spacer layer interposed between the pinned layer and the magnetic correction layer so as to provide exchange coupling. The interface between the magnetic correction layer and the spacer layer may have lower roughness than the other interfaces.

Furthermore, a mixing layer at the interface between the magnetic correction layer and the spacer layer may have a smaller thickness than mixing layers at the other interfaces. It possible to improve the characteristic of the variable resistance element without a structural change of the variable resistance element. Therefore, the semiconductor memory with improved operation characteristics may be provided. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
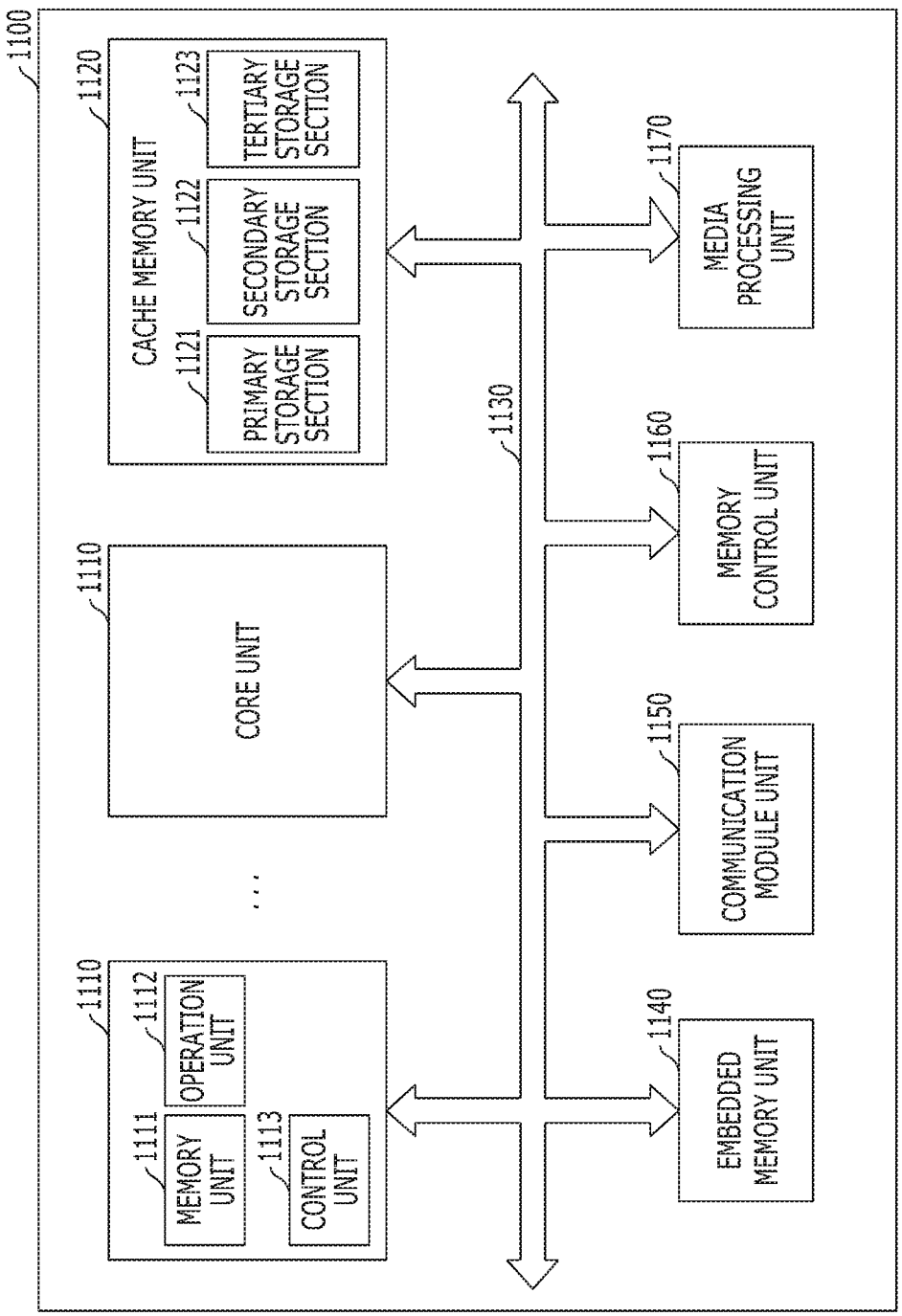
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations.

For example, the cache memory unit 1120 may include semiconductor memory which includes a variable resistance element. The variable resistance element may include a free layer having a changeable magnetization direction; a pinned layer having a magnetization direction pinned to a first direction; a tunnel barrier layer interposed between the free layer and the pinned layer; a magnetic correction layer having a magnetization direction pinned to a second direction which is the opposite direction of the first direction; and a spacer layer interposed between the pinned layer and the magnetic correction layer so as to provide exchange coupling. The interface between the magnetic correction layer and the spacer layer may have lower roughness than the other interfaces. Furthermore, a mixing layer at the interface between the magnetic correction layer and the spacer layer may have a smaller thickness than mixing layers at the other interfaces. It possible to improve the characteristic of the variable resistance element without a structural change of the variable resistance element. Therefore, the semiconductor memory with improved operation characteristics may be provided. Through this, the cache memory unit 1120 and the processor 1100 may have improved reliability.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device.

Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130.

The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
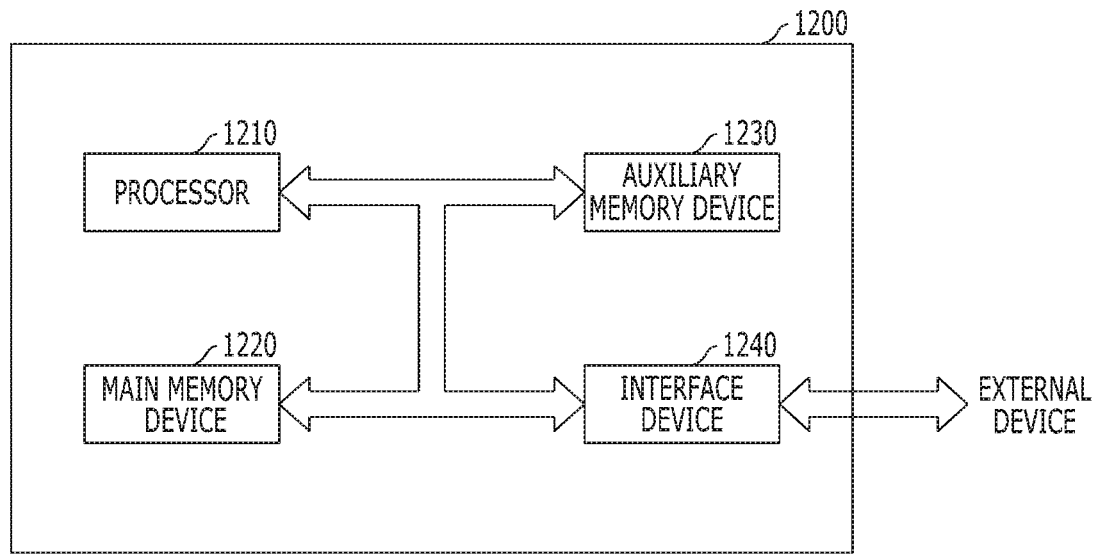
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include semiconductor memory which includes a variable resistance element. The variable resistance element may include a free layer having a changeable magnetization direction; a pinned layer having a magnetization direction pinned to a first direction; a tunnel barrier layer interposed between the free layer and the pinned layer; a magnetic correction layer having a magnetization direction pinned to a second direction which is the opposite direction of the first direction; and a spacer layer interposed between the pinned layer and the magnetic correction layer so as to provide exchange coupling.

The interface between the magnetic correction layer and the spacer layer may have lower roughness than the other interfaces. Furthermore, a mixing layer at the interface between the magnetic correction layer and the spacer layer may have a smaller thickness than mixing layers at the other interfaces. It possible to improve the characteristic of the variable resistance element without a structural change of the variable resistance element. Therefore, the semiconductor memory with improved operation characteristics may be provided. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations.

For example, the auxiliary memory device 1230 may include semiconductor memory which includes a variable resistance element. The variable resistance element may include a free layer having a changeable magnetization direction; a pinned layer having a magnetization direction pinned to a first direction; a tunnel barrier layer interposed between the free layer and the pinned layer; a magnetic correction layer having a magnetization direction pinned to a second direction which is the opposite direction of the first direction; and a spacer layer interposed between the pinned layer and the magnetic correction layer so as to provide exchange coupling. The interface between the magnetic correction layer and the spacer layer may have lower roughness than the other interfaces. Furthermore, a mixing layer at the interface between the magnetic correction layer and the spacer layer may have a smaller thickness than mixing layers at the other interfaces. It possible to improve the characteristic of the variable resistance element without a structural change of the variable resistance element. Therefore, the semiconductor memory with improved operation characteristics may be provided. Through this, the auxiliary memory device 1230 and the system 1200 may have improved reliability.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB), such as various devices which send and receive data without transmit lines, and so on.

Figure 10:
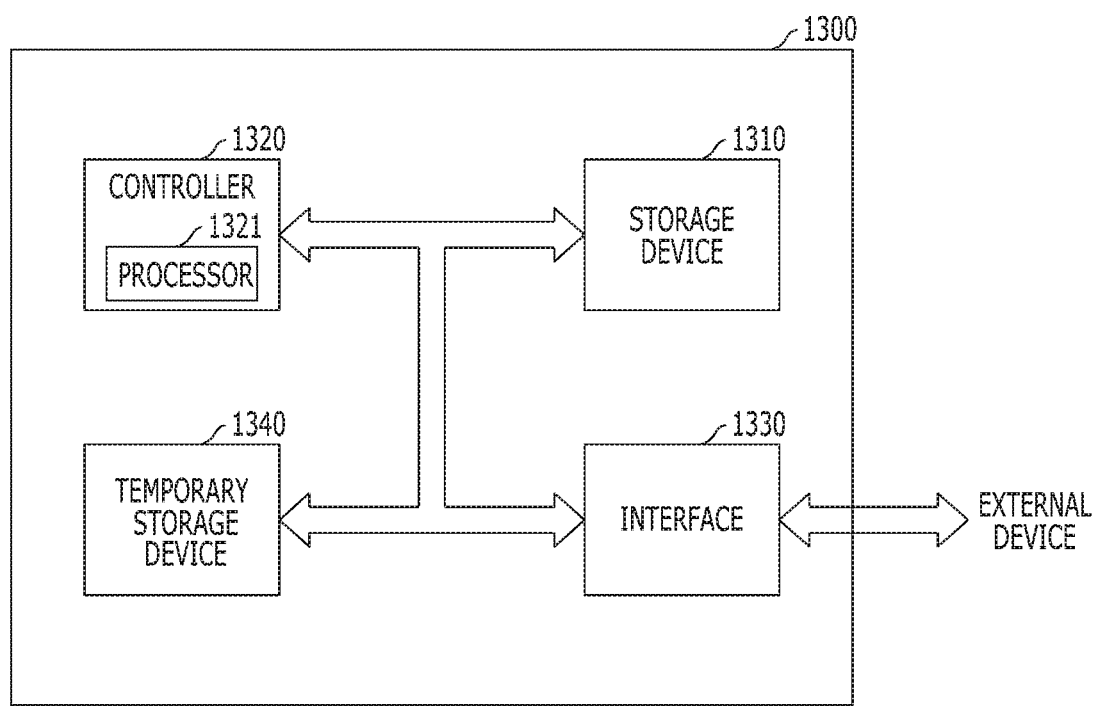
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include semiconductor memory which includes a variable resistance element. The variable resistance element may include a free layer having a changeable magnetization direction; a pinned layer having a magnetization direction pinned to a first direction; a tunnel barrier layer interposed between the free layer and the pinned layer; a magnetic correction layer having a magnetization direction pinned to a second direction which is the opposite direction of the first direction; and a spacer layer interposed between the pinned layer and the magnetic correction layer so as to provide exchange coupling. The interface between the magnetic correction layer and the spacer layer may have lower roughness than the other interfaces. Furthermore, a mixing layer at the interface between the magnetic correction layer and the spacer layer may have a smaller thickness than mixing layers at the other interfaces. It possible to improve the characteristic of the variable resistance element without a structural change of the variable resistance element. Therefore, the semiconductor memory with improved operation characteristics may be provided. Through this, the temporary storage device 1340 and the data storage system 1300 may have improved reliability.

Figure 11:
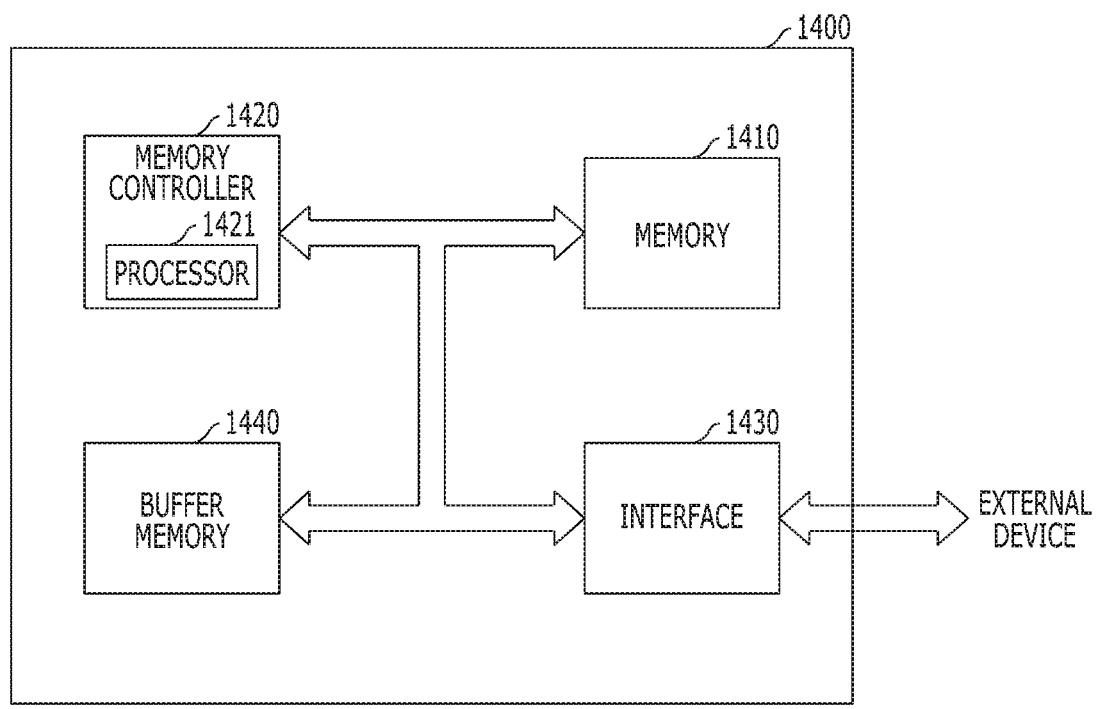
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include semiconductor memory which includes a variable resistance element. The variable resistance element may include a free layer having a changeable magnetization direction; a pinned layer having a magnetization direction pinned to a first direction; a tunnel barrier layer interposed between the free layer and the pinned layer; a magnetic correction layer having a magnetization direction pinned to a second direction which is the opposite direction of the first direction; and a spacer layer interposed between the pinned layer and the magnetic correction layer so as to provide exchange coupling. The interface between the magnetic correction layer and the spacer layer may have lower roughness than the other interfaces. Furthermore, a mixing layer at the interface between the magnetic correction layer and the spacer layer may have a smaller thickness than mixing layers at the other interfaces. It possible to improve the characteristic of the variable resistance element without a structural change of the variable resistance element. Therefore, the semiconductor memory with improved operation characteristics may be provided. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDRC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include semiconductor memory which includes a variable resistance element. The variable resistance element may include a free layer having a changeable magnetization direction; a pinned layer having a magnetization direction pinned to a first direction; a tunnel barrier layer interposed between the free layer and the pinned layer; a magnetic correction layer having a magnetization direction pinned to a second direction which is the opposite direction of the first direction; and a spacer layer interposed between the pinned layer and the magnetic correction layer so as to provide exchange coupling. The interface between the magnetic correction layer and the spacer layer may have lower roughness than the other interfaces. Furthermore, a mixing layer at the interface between the magnetic correction layer and the spacer layer may have a smaller thickness than mixing layers at the other interfaces. It possible to improve the characteristic of the variable resistance element without a structural change of the variable resistance element. Therefore, the semiconductor memory with improved operation characteristics may be provided. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7 to 11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

In accordance with the present implementations, the substrate may be cooled when the magnetic correction layer is formed, which makes it possible to improve the characteristic of the variable resistance element without a structural change of the variable resistance element.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising:
   a semiconductor memory,
   wherein the semiconductor memory comprises:
   a free layer having a changeable magnetization direction;
   a pinned layer having a magnetization direction pinned in a first direction;
   a tunnel barrier layer interposed between the free layer and the pinned layer;
   a magnetic correction layer having a magnetization direction pinned in a second direction, wherein the second direction is the opposite direction to the first direction; and
   a spacer layer interposed between the pinned layer and the magnetic correction layer,
   wherein the pinned layer and the magnetic correction layer exchange coupling with each other through the spacer layer, and wherein a roughness at an interface between the magnetic correction layer and the spacer layer is lower than a roughness at an interface between the spacer layer and the pinned layer.

2. The electronic device of claim 1, wherein a first mixing layer is formed at the interface between the magnetic correction layer and the spacer layer, wherein a second mixing layer is formed at the interface between the spacer layer and the pinned layer, and wherein a thickness of the first mixing layer is smaller than a thickness of the second mixing layer.

3. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

4. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

5. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory is part of the auxiliary memory device or the main memory device in the processing system.

6. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

7. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

8. The electronic device of claim 1, wherein the magnetic correction layer comprises a plurality of first layers and a plurality of second layers which are alternately stacked,
   wherein each of the plurality of first layers includes a magnetic material, and
   wherein each of the plurality of second layers includes a non-magnetic material.

9. The electronic device of claim 8, wherein the magnetic material includes Co, Fe, Ni, or a combination thereof.

10. The electronic device of claim 8, wherein the non-magnetic material includes Pt, Pd, or a combination thereof.

11. A method for fabricating an electronic device, comprising:
    forming a variable resistance element at a first temperature; and
    forming a magnetic correction layer over the pinned layer at a second temperature,
    wherein the second temperature is lower than the first temperature,
    wherein the variable resistance element includes a free layer provided over a substrate, a pinned layer provided over the free layer, a tunnel barrier layer interposed between the free layer and the pinned layer,
    wherein the magnetic correction layer has a magnetization direction which is anti-parallel to the pinned layer,
    wherein the first temperature is at 273K or more.

12. The method of claim 11,
    wherein the second temperature is at 0K-75K, inclusive.

13. The method of claim 11, wherein the forming of the magnetic correction layer comprises:
    (a) cooling the substrate to the second temperature;
    (b) forming a first layer over the cooled substrate;
    (c) forming a second layer over the first layer;
    (d) repeating the forming of the first layer and the forming of the second layer M number of times; and
    (e) recooling the substrate to a third temperature,
    wherein the third temperature is 0K-75K, inclusive, and
    where M is a positive integer.

14. The method of claim 13, wherein the steps (b)-(e) are repeated N number of times, and
    where N is a positive integer.

15. The method of claim 14,
    wherein N is 4-100.

16. The method of claim 13,
    wherein M is 1-100.

* * * * *